United States Patent
Kang et al.

(10) Patent No.: US 7,352,616 B2
(45) Date of Patent: Apr. 1, 2008

(54) PHASE CHANGE RANDOM ACCESS MEMORY, BOOSTING CHARGE PUMP AND METHOD OF GENERATING WRITE DRIVING VOLTAGE

(75) Inventors: Sang-beom Kang, Hwaseong-si (KR); Du-eung Kim, Yongin-si (KR); Hyung-rok Oh, Seongnam-si (KR); Kwang-jin Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 117 days.

(21) Appl. No.: 11/319,602

(22) Filed: Dec. 29, 2005

(65) Prior Publication Data
US 2007/0097741 A1 May 3, 2007

(30) Foreign Application Priority Data
Nov. 2, 2005 (KR) .................... 10-2005-0104148

(51) Int. Cl.
*G11C 11/00* (2006.01)
(52) U.S. Cl. ............. 365/163; 365/189.11; 365/189.05
(58) Field of Classification Search ............... 365/163, 365/189.11, 189.07
See application file for complete search history.

(56) References Cited

U.S. PATENT DOCUMENTS 5,659,519 A * 8/1997 Lee et al. ............... 365/230.06

2002/0154545 A1 * 10/2002 Tanaka et al. ......... 365/185.22

FOREIGN PATENT DOCUMENTS

| KR | 10-0238928 | 1/2000 |
| WO | WO 2004/090984 A1 | 10/2004 |

* cited by examiner

*Primary Examiner*—Huan Hoang
(74) *Attorney, Agent, or Firm*—Volentine & Whitt, PLLC

(57) ABSTRACT

A phase change random access memory on aspect includes a memory cell array block including a plurality of phase change memory cells, a column decoder, a row decoder, a column selector, and a write driver. The memory further includes a write boosting unit having a plurality of internal charge pumps which boost a first voltage to generate a write driving voltage which drives the write driver, where the number of internal charge pumps that are activated during a write operation is varied according to a number of phase change memory cells which are selected during the write operation. The memory still further includes a column boosting unit which boosts the first voltage to generate a column driving voltage which drives the column decoder, and a row boosting unit which boosts the first voltage to generate a row driving voltage which drives the row decoder.

21 Claims, 5 Drawing Sheets

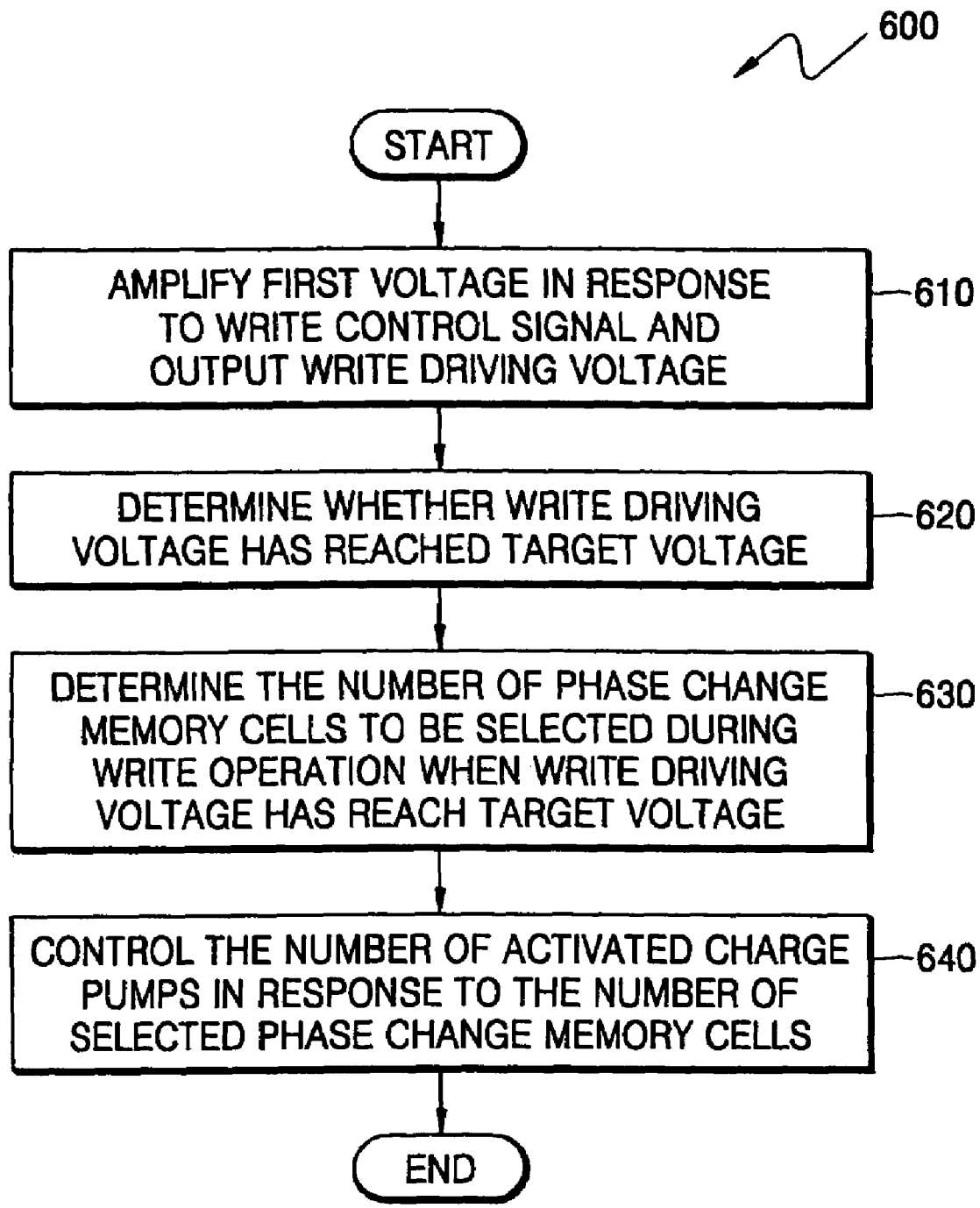

PHASE CHANGE RANDOM ACCESS MEMORY, BOOSTING CHARGE PUMP AND METHOD OF GENERATING WRITE DRIVING VOLTAGE

BACKGROUND OF THE INVENTION

1. Field of the Invention

The present invention generally relates to semiconductor devices, and more particularly, the present invention relates to charge pumps, phase change random access memories including charge pumps, and method of writing data into phase change random access memories.

A claim of priority is made to Korean Patent Application No. 10-2005-0104148, filed on Nov. 2, 2005, in the Korean Intellectual Property Office, the disclosure of which is incorporated herein in its entirety by reference.

2. Description of the Related Art

A phase-change random access memory (PRAM), also known as an Ovonic Unified Memory (OUM), includes a phase-change material such as a chalcogenide alloy which is responsive to energy (e.g., thermal energy) so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

As with other types of semiconductor memories, efforts are being made to reduce the level of supply voltage used to drive PRAM devices. However, any reduction in supply voltage can make it difficult to generate sufficient write currents to reliably program the state of the phase-change material as discussed in the preceding paragraph. Further, in the case of low level supply voltages, the selection of phase change cells can become problematic due to voltage drops caused by parasitic resistance between the power supply voltage and the phase change memory cells.

As such, it may become necessary to rely on voltage boosting circuits when, for example, generating write currents for programming PRAM device. In this case, a boosted voltage is utilized to drive portions of the PRAM device. However, due to extremely small size of components making up a PRAM device, excess exposure to boosted voltages can adversely affect the overall reliability of the PRAM device. It is thus desirable to minimize the period of time during which internal circuits of the PRAM are exposed to high voltages.

It has been suggested to utilize a boosted voltage for write operations of the PRAM device, and to utilize a power supply voltage for other operations, such as read and standby operations. However, in this case, a charge pump is activated prior to each write operation in order to increase a drive voltage to the boosted voltage. This process takes time, and disadvantageously results in a delay in execution of the write operation.

SUMMARY OF THE INVENTION

According to an aspect of the present invention, a phase change random access memory is provided which includes a memory cell array block including a plurality of phase change memory cells, a column decoder, a row decoder, a column selector, and a write driver. The memory further includes a write boosting unit having a plurality of internal charge pumps which boost a first voltage to generate a write driving voltage which drives the write driver, where the number of internal charge pumps that are activated during a write operation is varied according to a number of phase change memory cells which are selected during the write operation. The memory still further includes a column boosting unit which boosts the first voltage to generate a column driving voltage which drives the column decoder, and a row boosting unit which boosts the first voltage to generate a row driving voltage which drives the row decoder.

According to another aspect of the present invention, a boosting charge pump is provided which includes a voltage boosting unit which amplifies a first voltage in response to a write control signal and outputs a write driving voltage, a level detector which generates a detection signal when the write driving voltage reaches a target voltage, and a driving controller which is responsive to the detection signal to control the voltage boosting unit according to a mode signal indicative of a selected number of memory cells.

According to still another aspect of the present invention, a phase change random access memory is provided which includes a plurality of charge pumps connected in parallel, where the number of charge pumps activated during a write operation is controlled in response to the number of phase change memory cells to which data is written.

According to yet another aspect of the present invention, a method is provided for generating a write driving voltage for driving a write driver of a phase change random access memory including a plurality of charge pumps connected in parallel. The method includes amplifying a first voltage in response to a write control signal to output the write driving voltage, determining whether the write driving voltage has reached a target voltage, determining a number of phase change memory cells to be selected during a write operation, and controlling a number of activated charge pumps when the write driving voltage has reached the target voltage in accordance with the number of selected phase change memory cells.

BRIEF DESCRIPTION OF THE DRAWINGS

The above and other aspects and features of the present invention will become readily apparent from the detailed description that follows, with reference to the accompanying drawings, in which:

FIG. 6 is a flow chart illustrating a method of generating a write driving voltage according to an embodiment of the present invention.

DETAILED DESCRIPTION OF PREFERRED EMBODIMENTS

Figure 1:
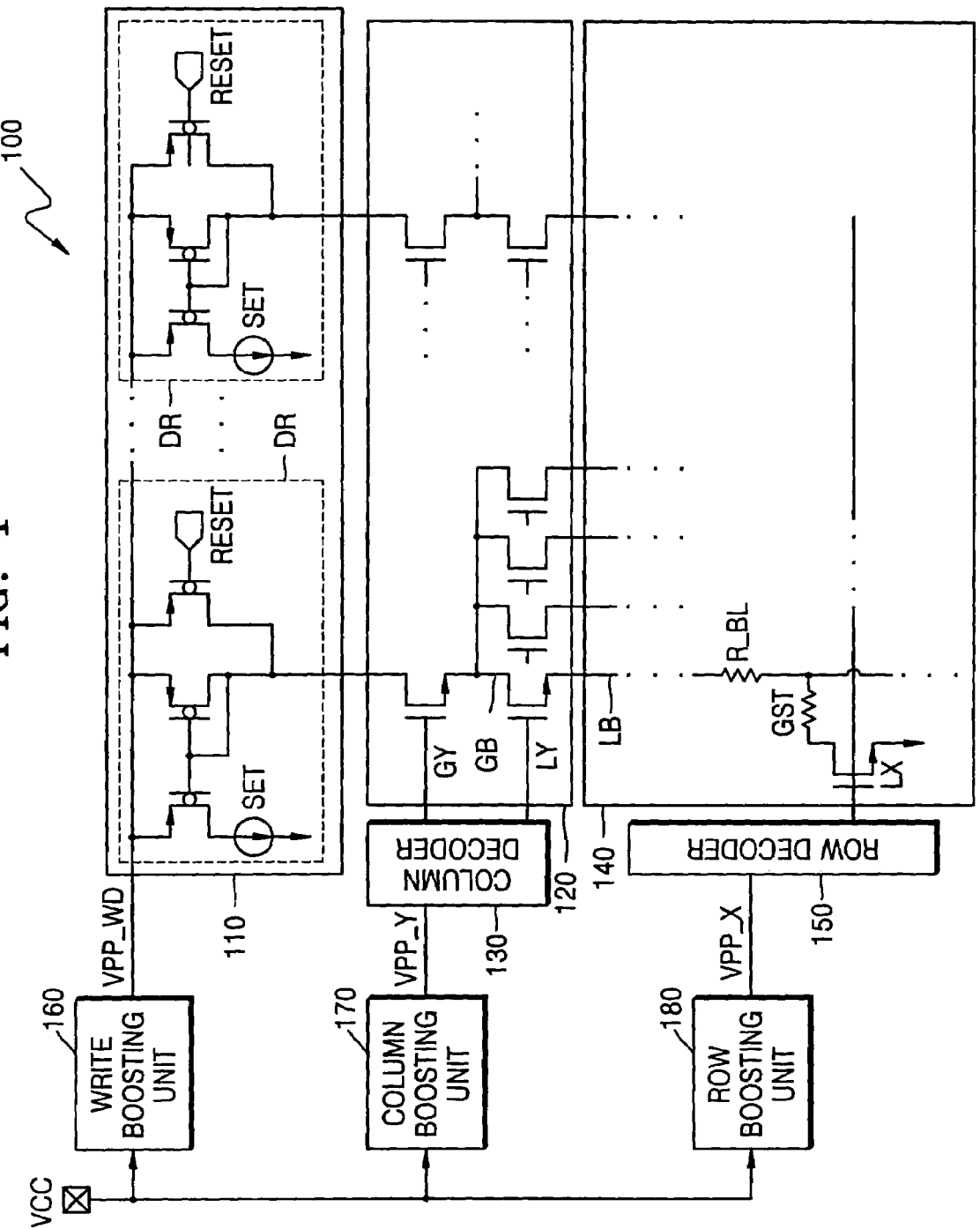
FIG. 1 illustrates a phase change random access memory according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

FIG. 1 illustrates a phase change random access memory (PRAM) 100 according to an embodiment of the present invention. Referring to FIG. 1, the phase change random access memory 100 includes a memory cell array block 140 having a plurality of phase change memory cells, a column decoder 130, a row decoder 150, a write driver 110, a column selector 120, a write boosting unit 160, a column boosting unit 170, and a row boosting unit 180.

Each of the phase change memory cells of the memory cell array block 140 includes a phase change element GST and a transistor LX connected between a local bit line LB and a reference voltage (ground). The gate of the transistor LX is controlled by the row decoder 150.

The column selector 120 includes a plurality of global bit lines GB, a plurality of global column select transistors GY, and a plurality of local column select transistors LY. The gates of the global column select transistors GY and the local column select transistors LY are controlled by the column decoder 130. Each global column select transistor GY is connected between the write driver 110 and a corresponding global bit line GB, and each local column select transistor LY is connected between a global bit line GB and a corresponding local bit line LB.

The write driver 110 transmits a set current or reset current to the memory cell array block 140 in a write operation. The write driver 110 includes a plurality of drive circuits DR respectively corresponding to the global bit lines GB.

The write boosting unit 160 boosts a first voltage VCC to generate a write driving voltage VPP_WD which drives the write driver 110. The column boosting unit 170 boosts the first voltage VCC to generate a column driving voltage VPP_Y which drives the column decoder 130. The row boosting unit 180 boosts the first voltage VCC to generate a row driving voltage VPP_X which drives the row decoder 150.

As will be explained in more detail later, the write boosting unit 160, the column boosting unit 170 and the row boosting unit 180 each include a plurality of internal charge pumps. According to an embodiment of the present invention, the number of activated internal charge pumps of the write boosting unit 160 is varied with the number of phase change memory cells selected during a write operation.

Furthermore, the number of activated charge pumps in the column boosting unit 170 and in the row boosting unit 180 may also be varied during the write operation. That is, the number of internal charge pumps of the column boosting unit 170 and the row boosting unit 180 which are activated while the column driving voltage VPP_Y and row driving voltage VPP_X respectively reach predetermined first and second target voltages after a write operation is started, is larger than the number of internal charge pumps activated after the column driving voltage VPP_Y and row driving voltage VPP_X respectively have reached the first and second target voltages.

Figure 2:
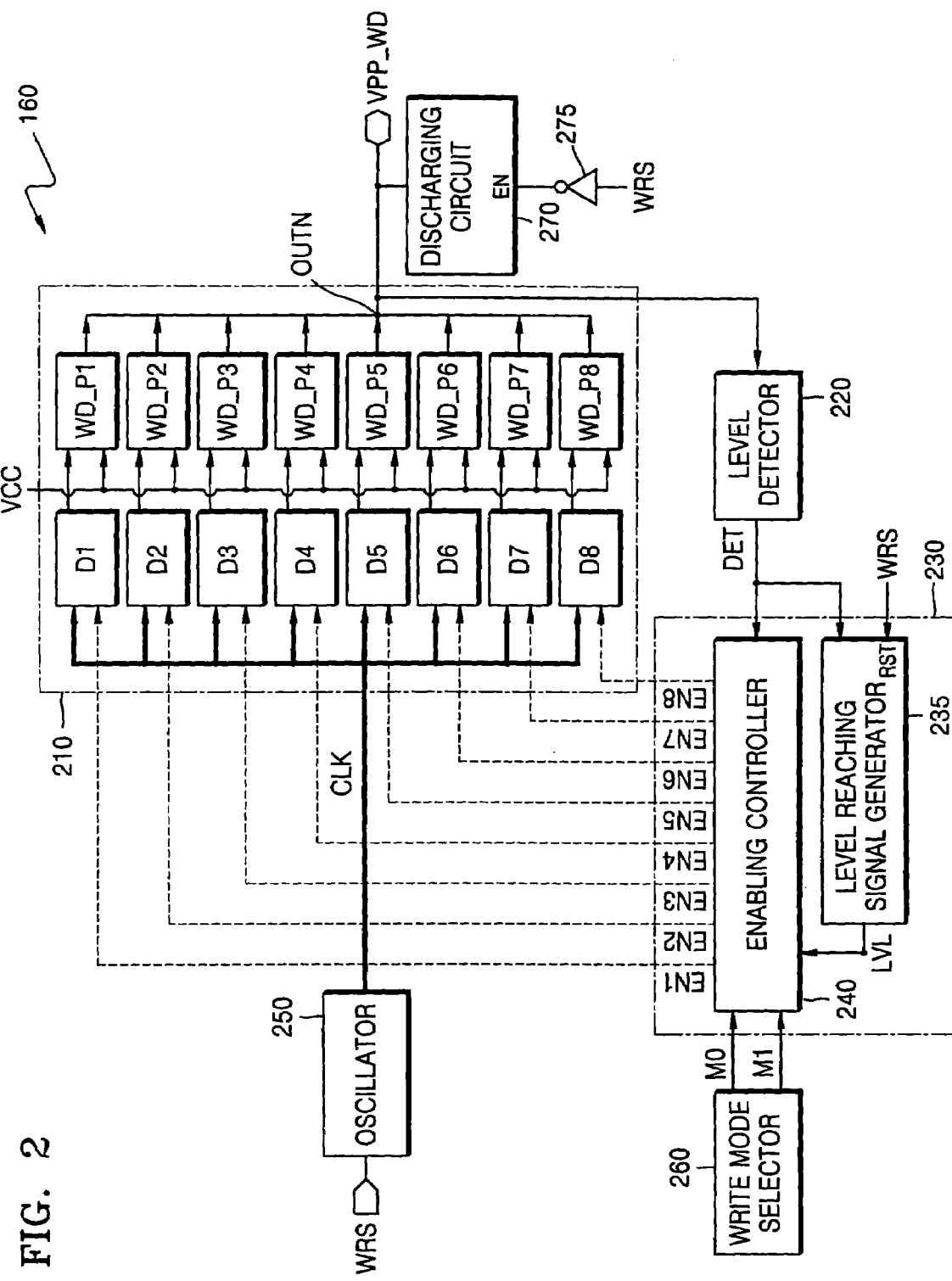
FIG. 2 is a block diagram of the write boosting unit of FIG. 1 according to an embodiment of the present invention.

FIG. 2 is a block diagram of the write boosting unit 160 of FIG. 1 according to an embodiment of the present invention. Referring to FIG. 2, the write boosting unit 160 includes a voltage boosting part 210, a level detector 220, a driving controller 230, an oscillator 250, a write mode selector 260, a discharging unit 270, and an inverter 275.

The voltage boosting part 210 includes a plurality of charge pumps WD_P1 through WD_P8 which are selectively enabled by corresponding enable circuits D1 through D8. The enable circuits D1 through D8 operate under control of enable signals EN1 through EN8 and a clock signal CLK. The voltage boosting part 210 amplifies a first voltage VCC in response to a write control signal WRS and outputs the write driving voltage VPP_WD to an output node OUTN.

The discharging circuit 270 discharges the output node OUTN to a first voltage level (e.g., VCC) in response to an inverted write control signal WRS output by the inverter 275.

The oscillator 250 generates the clock signal CLK in response to the write control signal WRS.

The level detector 220 generates a detection signal DET indicative of whether the write driving voltage VPP_WD has reached a third target voltage.

The write mode selector 260 generates write mode signals M0 and M1 which are indicative of the number of memory cells to be selected in a write operation.

The driving controller 230 includes a level reaching signal generator 235 and an enabling controller 240, each of which receives the detection signal DET from the level detector 220. The level reaching signal generator 235 generates a level reaching signal LVL when the write driving voltage VPP_WD initially reaches the third target voltage. The enabling controller is responsive to the write mode signals M0 and M1 and the level reaching signal LVL to generate the enable signals EN1 through EN8 used to control the enable circuits D1 through D8 of the voltage boosting part 210.

The phase change random access memory 100 according to the current embodiment of the present invention can increase or decrease the number of activated charge pumps in order to reduce a period of time required for boosting the first voltage VCC using charge pumps in a write operation. The number of activated charge pumps can be varied with the number of phase change memory cells selected when a write operation is carried out. This principle can be applied to the write boosting unit 160, the column boosting unit 170 and the row boosting unit 180.

The operation of the write boosting unit 160 of FIG. 2 will explained in more detail with reference to the timing diagram of FIG. 3. It is noted that the invention is not limited by the particular logic HIGH and LOW signal relationships illustrated in FIG. 3.

Initially, in a read or stand-by operational mode, the write control signal is LOW. The detection signal DET and the level reaching signal LVL are also LOW in this state.

In a write operational mode, the write control signal WRS is enabled to HIGH. As a result, the discharging circuit 270 is disabled and the oscillator 250 generates the clock signal CLK.

During an initial period A of the write operational mode, the write driving voltage VPP_WD rises to the third target voltage. During this time, only a subset of the enable circuits D1 through D8 are preferably activated by the enable signals EN1 through EN8, respectively. Accordingly, only a subset of the charge pumps WD_P1 through WD_P8 are preferably enabled during the period A. For example, during the initial period A, only the charge pumps WD_P7 and WD_P8 may be activated to boost the first voltage VCC and output the boosted voltage to the output node OUTN. Here, the first voltage VCC can be a power supply voltage. Alternatively, the first voltage VCC can be a voltage some other voltage applied to the phase change random access memory.

The number of enabled charge pumps WD_P1 through WD_P8 will determine the rise time to the third target voltage. That is, the higher the number of enable charge pumps WD_P1 through WD_P8, the faster the third target voltage can be reached. However, a high number of enable charge pumps WD_P1 through WD_P8 also translates into a high current consumption. Accordingly, when selecting the number of enable charge pumps WD_P1 through WD_P8, there is a tradeoff between increasing the rise time of the voltage at the output node OUTN and decreasing the current consumption.

Figure 3:
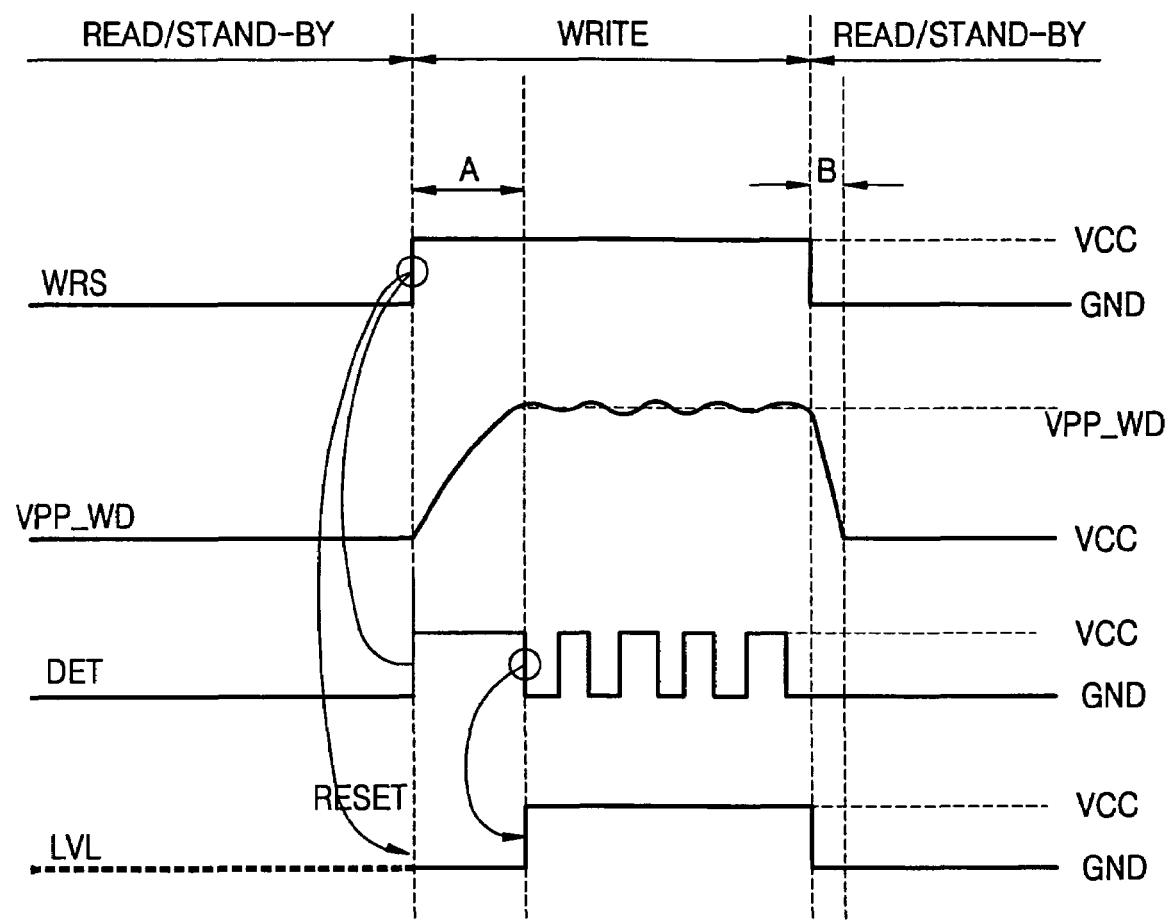
FIG. 3 is a timing diagram for explaining an operation of the write boosting unit of FIG. 2 according to an embodiment of the present invention.

When the voltage at the output node OUTN reaches the third target voltage, the level detector 220 generates the detection signal DET having a LOW level as illustrated in FIG. 3.

The level reach signal generator 235 detects the LOW level of the detection signal DET, and drives the level reaching signal LVL to HIGH. The enabling controller 240, in response to the level reaching signal LVL going HIGH, generates the enable signals EN1 through EN8 in according with the detection signal DET and the write mode signals M0 and M1.

As discussed previously, the write mode selector 260 determines the number of phase change memory cells to be selected during a write operation and outputs a corresponding value as the mode signal M0 and M1. The enabling controller 240 determines the number of charge pumps to be operated based on the mode signal M0 and M1 and activates corresponding ones of the enable signals EN1 through EN8.

In this example, each of the mode signals M0 and M1 is a binary signal having a logic value of 0 or 1. As such, four write modes are possible. For example, if two cells are selected during the write operation, then the mode signals M0 and M1 can be 00. Four selected cells can correspond to M0 and M2 being 01, eight selected cells can correspond to M0 and M1 being 10, and sixteen selected cells can correspond to M0 and M1 being 11. While FIG. 2 illustrates a two-bit mode signal M0 and M1, the mode signal is not limited to two bits.

Using the mode signals M0 and M1, the number of enabled charge pumps is also controlled in accordance with the number of selected phase change memory cells. As an example, when two phase change memory cells are selected (i.e., M0 and M2 are 00 in the example above), only the enable signal EN1 may be enabled and applied to the enabling circuit D1 so as to operate the charge pump WD_P1. When four phase change memory cells are selected (i.e., M0 and M1 are 01 in the example above), the enable signals EN1 and EN2 may be enabled and applied to the enabling circuits D1 and D2 to active the charge pumps WD_P1 and WD_P2. When eight phase change memory cells are selected (i.e., M0 and M1 are 10 in the example above), enable signals EN1, EN2, EN3 and EN4 may be enabled and applied to the enabling circuits D1, D2, D3 and D4 to activate the charge pumps WD_P1, WD_P2, WD_P3 and WD_P4. When sixteen phase change memory cells are selected (i.e., M0 and M1 are 11 in the example above), enable signals EN1 through EN8 are enabled may be enable and applied to the enabling circuits D1 through D8 to activate all the charge pumps WD_P1 through WD_P8. The invention, of course, is not limited to the particular examples.

The enabling controller 240 outputs the enable signals EN1 through EN8 in response to the mode signals M0 and M1 when the detection signal DET input thereto has the second level and the level reaching signal LVL is enabled. The circuit configuration of the enabling controller 240 can be understood by those skilled in the art and therefore a description thereof is omitted.

When the detection signal DET is at the first level during a write operation, that is, when the write driving voltage VPP_WD becomes lower than the third target voltage, the charge pumps WD_P7 and WD_P8 that were operated in the period A can optionally be operated again by the clock signal CLK.

At the end of the write operational mode, the control signal WRS is disabled (LOW). As a result, during time period B of FIG. 3, the discharging circuit 270 discharges the voltage of the output node OUTN to the first voltage VCC.

The discharging circuit 270 receives the inverted write control signal WRS through the inverter 275. When the write control signal WRS is disabled, the level reaching signal generator 235 is reset in response to the write control signal WRS and the level reaching signal LVL becomes LOW.

The column boosting unit 170 and the row boosting unit 180 of FIG. 1 may be similarly configured as the write boosting circuit 160 shown in FIG. 2 and may operate similarly to the timing diagram of FIG. 3.

Figure 4:
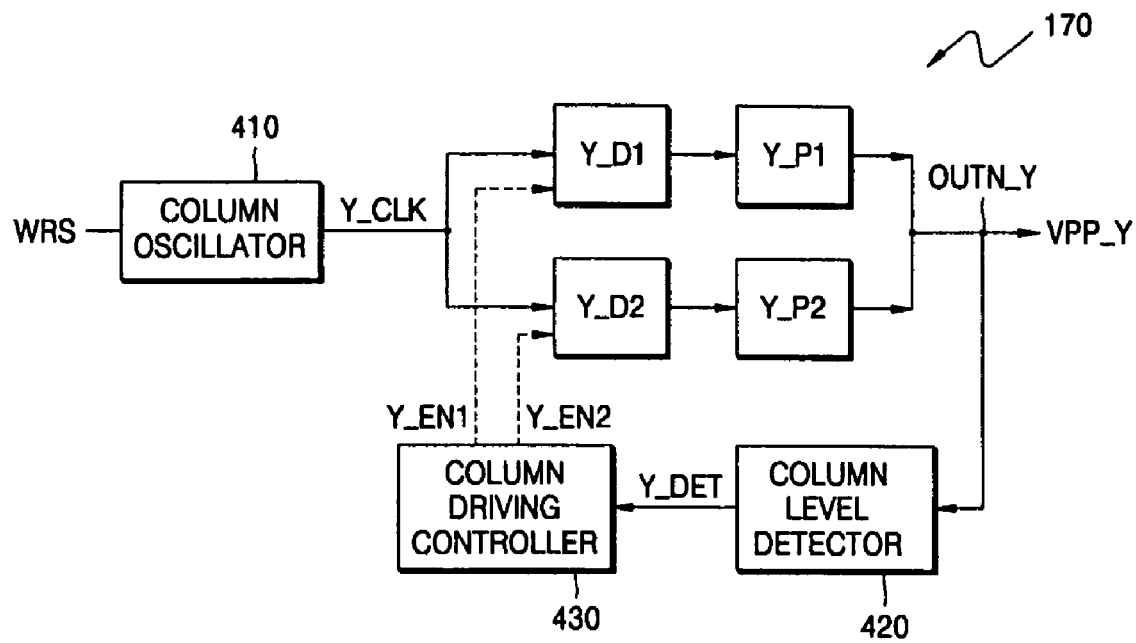
FIG. 4 is a block diagram of a column boosting unit of FIG. 1 according to an embodiment of the present invention.
Figure 5:
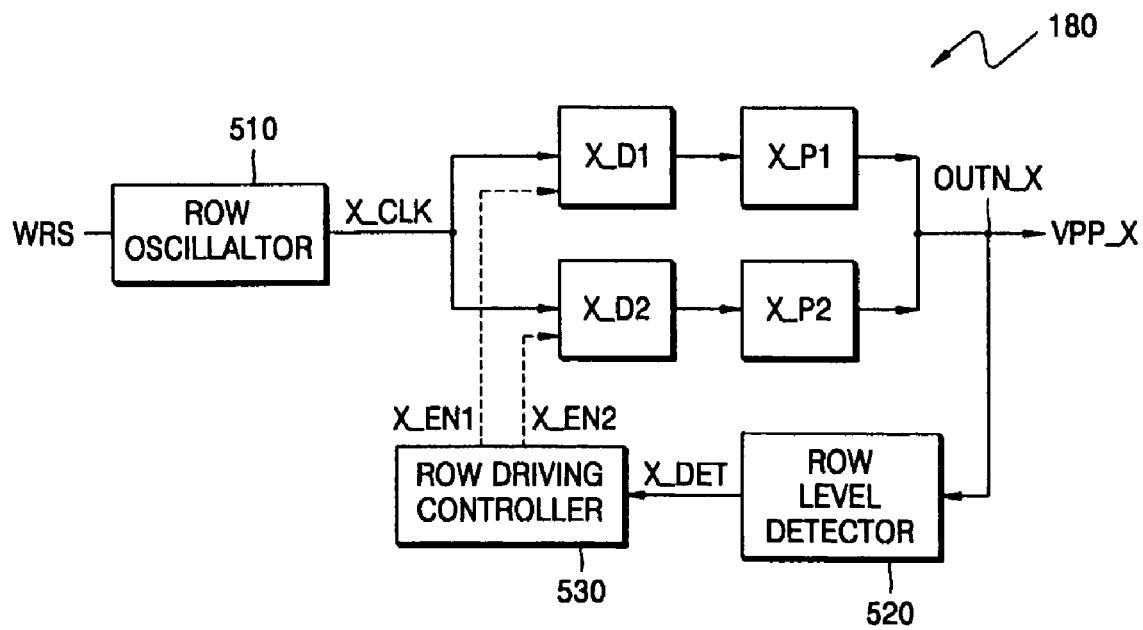
FIG. 5 is a block diagram of a row boosting unit of FIG. 1 according to an embodiment of the present invention.

FIG. 4 is a block diagram of the column boosting unit 170 of FIG. 1, and FIG. 5 is a block diagram of the row boosting unit 180 of FIG. 1. The column boosting unit 170 and the row boosting unit 180 drive a predetermined number of internal charge pumps to boost the column driving voltage VPP_Y and the row driving voltage VPP_X to required target voltages, respectively, within a short period of time (i.e., period A of FIG. 3). The column boosting unit 170 and the row boosting unit 180 drive transistors consuming a small amount of current during a write operation, as known from FIG. 1, and thus the number of operated charge pumps can be reduced.

Referring to FIG. 4, the column boosting unit 170 includes a column oscillator 410, column enabling circuits Y_D1 and Y_D2, column charge pumps Y_P1 and Y_P2, a column level detector 420, and a column driving controller 430. The column oscillator 410 generates a column clock signal Y_CLK in response to the write control signal WRS. The column enabling circuits Y_D1 and Y_D2 drive the charge pumps Y_P1 and Y_P2 respectively corresponding thereto in response to the column clock signal Y_CLK or predetermined column enable signals Y_EN1 and Y_EN2.

The column charge pumps Y_P1 and Y_P2 respectively correspond to the column enabling circuits Y_D1 and Y_D2, output the voltage boosted from the first voltage VCC to a column output node OUTN_Y, and are connected in parallel with the column output node OUTN_Y. The column level detector 420 generates a column detection signal Y_DET indicative of whether the column driving voltage VPP_Y is identical to the first target voltage or not. The column driving controller 430 receives the column detection signal Y_DET and, when the column driving voltage VPP_Y has reached the first target voltage, generates the column enable signals Y_EN1 and Y_EN2.

The operating principle of the column boosting unit 170 is identical to that of the write boosting unit 160. When the write control signal WRS is enabled, the column oscillator 410 generates the column clock signal Y_CLK to drive the column enabling circuits Y_D1 and Y_D2 and the column charge pumps Y_P1 and Y_P2. While FIG. 4 illustrates two column enabling circuits Y_D1 and Y_D2 and two column charge pumps Y_P1 and Y_P2, the number of the column enabling circuits Y_D1 and Y_D2 and the number of column charge pumps Y_P1 and Y_P2 is not limited to two.

The column level detector 420 generates the column detection signal Y_DET. When the column detection signal Y_DET indicates that the column driving voltage VPP_Y has reached the first target voltage, the column driving controller 430 enables one of the column enable signals Y_EN1 and Y_EN2. Here, the enabled column enable signal Y_EN1 or Y_EN2 stops the operations of the column enabling circuit Y_D1 or Y_D2 and column charge pump Y_P1 or Y_P2 corresponding thereto. For example, the column enable signal Y_EN1 is enabled when the column driving voltage VPP_Y has reached the first target voltage. Then, the operations of the column enabling circuit Y_D1 and the column charge pump Y_P1 are stopped. The first target voltage can be a minimum voltage at which the column decoder 130 can be operated during a write operation.

Referring to FIG. 5, the row boosting unit 180 includes a row oscillator 510, row enabling circuits X_D1 and X_D2, row charge pumps X_P1 and X_P2, a row level detector 520, and a row driving controller 530. The row oscillator 510 generates a row clock signal X_CLK in response to the write control signal WRS. The row enabling circuits X_D1 and X_D2 respectively drive the charge pumps X_P1 and X_P2 respectively corresponding thereto in response to the row clock signal X_CLK or predetermined row enable signals X_EN1 and X_EN2.

The row charge pumps X_P1 and X_P2 respectively correspond to the row enabling circuits X_D1 and X_D2, output the voltage boosted from the first voltage VCC to a row output node OUTN_X, and are connected in parallel with the row output node OUTN_X. The row level detector 520 generates a row detection signal X_DET indicative of whether the row driving voltage VPP_X is identical to the second target voltage or not. The row driving controller 530 receives the row detection signal X_DET and, when the row driving voltage VPP_X has reached the second target voltage, generates the row enable signals X_EN1 and X_EN2.

The row driving controller 530 controls the row enable signals X_EN1 and X_EN2 when the row driving voltage VPP_X has reached the second target voltage to reduce the number of activated row charge pumps X_P1 and X_P2. The second target voltage can be a minimum voltage at which the row decoder 150 can be operated during the write operation.

The operation and circuit configuration of the row boosting unit 180 are similar to those of the column boosting unit of FIG. 4 and therefore a detailed description thereof is omitted here to avoid redundancy.

FIG. 6 is a flow chart illustrating a method 600 of generating a write driving voltage according to an embodiment of the present invention. The method 600 of generating a write driving voltage for driving a phase change random access memory including a plurality of charge pumps connected in parallel includes a step 610 of amplifying a first voltage in response to a write control signal to output a write driving voltage, a step 620 of determining whether the write driving voltage has reached a target voltage, a step 630 of determining the number of phase change memory cells to be selected during a write operation when the write driving voltage has reached the target voltage, and a step 640 of controlling the number of activated charge pumps in response to the number of phase change memory cells to be selected.

The write driving voltage generating method 600 illustrated in FIG. 6 corresponds to the operation of the write boosting unit 160 of FIG. 1.

The write driving voltage generating method 600 can further include a step of determining whether a column driving voltage driving a column decoder and a row driving voltage driving a row decoder have reached predetermined target voltages, and a step of reducing the number of charge pumps activated to generate the column driving voltage and the row driving voltage when the column driving voltage and the row driving voltage have reached predetermined target voltages.

The method of controlling the column driving voltage and the row driving voltage respectively correspond to the operation of the column boosting unit 170 of FIG. 4 and the operation of the row boosting unit 180 of FIG. 5 described previously.

As described above, the phase change random access memory and the method of generating the write driving voltage according to the present invention can vary the number of activated charge pumps in response to the number of selected memory cells. Accordingly, the operating speed of the phase change random access memory can be improved and current consumption thereof can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase change random access memory comprising a memory cell array block including a plurality of phase change memory cells, a column decoder, a row decoder, a column selector, and a write driver, said memory further comprising:
   a write boosting unit having a plurality of internal charge pumps which boost a first voltage to generate a write driving voltage which drives the write driver, wherein the number of internal charge pumps that are activated during a write operation is varied according to a number of phase change memory cells which are selected during the write operation;
   a column boosting unit which boosts the first voltage to generate a column driving voltage which drives the column decoder; and a row boosting unit which boosts the first voltage to generate a row driving voltage which drives the row decoder.

2. The phase change random access memory of claim 1, wherein each of the column boosting unit and the row boosting unit comprises a plurality of internal charge pumps,
wherein the number of internal charge pumps of the column boosting unit which are activated while the column driving voltage reaches a first target voltage from the start of the write operation, is smaller than the number of internal charge pumps that are activated after the column driving voltage has reached the first target voltage, and
wherein the number of internal charge pumps of the row boosting unit which are activated while the row driving voltage reaches a second target voltage from the start of the write operation, is smaller than the number of internal charge pumps that are activated after the row driving voltage has reached the second target voltage.

3. The phase change random access memory of claim 1, wherein the write boosting unit comprises:
a voltage boosting unit which includes the plurality of internal charge pumps, which amplifies the first voltage in response to a write control signal, and which outputs the write driving voltage to an output node;
a level detector which generates a detection signal when the write driving voltage reaches a third target voltage; and
a driving controller which is responsive to the detection signal to generate a plurality of charge pump enable signals according to a write mode signal, wherein the write mode signal is indicative of the number of phase change memory cells which are selected during the write operation.

4. The phase change random access memory of claim 3, wherein the voltage boosting unit comprises a plurality of enabling circuits which activate the plurality of charge pumps in response to the plurality of charge pump enable signals, respectively.

5. The phase change random access memory of claim 4, further comprising an oscillator which generates a clock signal in response to the write control signal, the clock signal driving part of the enabling circuits while the write driving voltage reaches the third target voltage from a time when the write operation is started.

6. The phase change random access memory of claim 3, wherein the detection signal has a first level prior to when the write driving voltage reaches the third target voltage and has a second level when the write driving voltage reaches the third target voltage.

7. The phase change random access memory of claim 3, wherein the driving controller comprises:
a level reaching signal generator which generates a level reaching signal in response to the detection signal and which resets the level reaching signal when the write control signal is disabled; and
an enabling controller which selectively enables the charge pump enable signals according to the detection signal and the write mode signal during an enabled period of the level reaching signal.

8. The phase change random access memory of claim 7, wherein the write boosting unit further comprises a write mode selector which generates the mode signal, and a discharging circuit which discharges the voltage of the output node to the first voltage when the write control signal is disabled.

9. The phase change random access memory of claim 1, wherein the column boosting unit comprises:
a column oscillator which generates a column clock signal in response to the write control signal;
a plurality of column charge pumps which boost the first voltage and output a boosted column voltage to a column output node;
a plurality of column enabling circuits which activate the plurality of column charge pumps, respectively, in response to the column clock signal or column enable signals;
a column level detector which generates a column detection signal when the column driving voltage reaches a first target voltage; and
a column driving controller which is responsive to the column detection signal to generate the column enable signals so as to reduce the number of activated charge pumps when the column driving voltage reaches the first target voltage.

10. The phase change random access memory of claim 1, wherein the row boosting unit comprises:
a row oscillator which generates a row clock signal in response to a write control signal;
a plurality of row charge pumps which boost the first voltage and output a boosted row voltage to a row output node;
a plurality of row enabling circuits which activate the plurality of row charge pumps, respectively, in response to the row clock signal or row enable signals;
a row level detector which generates a row detection signal when the row driving voltage reaches a second target voltage; and
a row driving controller which is responsive to the row detection signal to generate the row enable signals so as to reduce the number of activated charge pumps when the row driving voltage reaches the second target voltage.

11. A boosting charge pump, comprising:
a voltage boosting unit which amplifies a first voltage in response to a write control signal and outputs a write driving voltage;
a level detector which generates a detection signal when the write driving voltage reaches a target voltage; and
a driving controller which is responsive to the detection signal to control the voltage boosting unit according to a mode signal indicative of a selected number of memory cells.

12. The boosting charge pump of claim 11, wherein the voltage boosting unit comprises:
a plurality of charge pumps connected in parallel to an output node;
a plurality of enabling circuits which activate the plurality of charge pumps, respectively, under control of the driving controller.

13. The boosting charge pump of claim 12, further comprising an oscillator which generates a clock signal in response to the write control signal, the clock signal driving part of the enabling circuits while the write driving voltage reaches the target voltage from a time when a write operation is started.

14. The boosting charge pump of claim 12, wherein the detection signal has a first level prior to when the write driving voltage reaches the target voltage and has a second level when the write driving voltage reaches the target voltage.

15. The boosting charge pump of claim 12, wherein the enabling circuits activate the plurality of charge pumps in response to respective charge pump enable signals, and wherein the driving controller comprises:
  a level reaching signal generator which generates a level reaching signal in response to the detection signal and which resets the level reaching signal when the write control signal is disabled; and
  an enabling controller which selectively enables the charge pumps enable signals according to the detection signal and the mode signal during an enabled period of the level reaching signal.

16. The boosting charge pump of claim 12, further comprising:
  a write mode selector which generates the mode signal; and
  a discharging circuit which discharges the voltage of the output node to the first voltage when the write control signal is disabled.

17. A phase change random access memory comprising a plurality of charge pumps connected in parallel, wherein the number of charge pumps activated during a write operation is controlled in response to the number of phase change memory cells to which data is written.

18. The phase change random access memory of claim 17, wherein the activated charge pumps generate a write driving voltage which drives a write driver.

19. The phase change random access memory of claim 17, further comprising:
  a column boosting unit comprising a plurality of charge pumps which generate a column driving voltage which drives a column decoder; and
  a row boosting unit comprising a plurality of charge pumps which generate a row driving voltage which drives a row decoder,
  wherein the column boosting unit reduces the number of activated charge pumps thereof when the column driving voltage reaches a first target voltage after a write control signal has been enabled, and wherein the row boosting unit reduces the number of activated charge pumps thereof when the row driving voltage reaches a second target voltage after the write control signal is enabled.

20. A method of generating a write driving voltage for driving a write driver of a phase change random access memory comprising a plurality of charge pumps connected in parallel, comprising:
  amplifying a first voltage in response to a write control signal to output the write driving voltage;
  determining whether the write driving voltage has reached a target voltage;
  determining a number of phase change memory cells to be selected during a write operation; and
  controlling a number of activated charge pumps when the write driving voltage has reached the target voltage in accordance with the number of selected phase change memory cells.

21. The method of claim 20, further comprising:
  determining whether a column driving voltage driving a column decoder and a row driving voltage driving a row decoder have reached predetermined target voltages; and
  reducing a number of charge pumps activated to generate the column driving voltage and the row driving voltage when the column driving voltage and the row driving voltage have reached the target voltages.

* * * * *

UNITED STATES PATENT AND TRADEMARK OFFICE
CERTIFICATE OF CORRECTION

PATENT NO. : 7,352,616 B2  
APPLICATION NO. : 11/319602  
DATED : April 1, 2008  
INVENTOR(S) : Kang et al.

Page 1 of 1

It is certified that error appears in the above-identified patent and that said Letters Patent is hereby corrected as shown below:

Column 10, Line 7, Claim 17, delete "conductor" and insert in lieu thereof -- element --

Column 10, Line 11, Claim 18, delete "conductor" and insert in lieu thereof -- element --

Column 10, Line 15, Claim 19, delete "conductor" and insert in lieu thereof -- element --

Column 10, Line 19, Claim 20, delete "conductor" and insert in lieu thereof -- element --

Column 10, Line 23, Claim 21, delete "conductor" and insert in lieu thereof -- element --

Column 10, Line 28, Claim 22, delete "conductor" and insert in lieu thereof -- element --

Signed and Sealed this

Seventh Day of October, 2008

JON W. DUDAS  
*Director of the United States Patent and Trademark Office*